(12) United States Patent
Lemmer et al.

(10) Patent No.: US 9,660,167 B2
(45) Date of Patent: May 23, 2017

(54) WOUND AND FOLDED THERMOELECTRIC SYSTEMS AND METHOD FOR PRODUCING SAME

(71) Applicant: KARLSRUHER INSTITUT FUER TECHNOLOGIE, Karlsruhe (DE)

(72) Inventors: Ulrich Lemmer, Karlsruhe (DE); Siegfried Kettlitz, Karlsruhe (DE); André Gall, Karlsruhe (DE); Marcel Gueltig, Karlsruhe (DE)

(73) Assignee: KARLSRUHER INSTITUT FUER TECHNOLOGIE, Karlsruhe (DE)

( * ) Notice: Subject to any disclaimer, the term of this patent is extended or adjusted under 35 U.S.C. 154(b) by 97 days.

(21) Appl. No.: 14/407,113

(22) PCT Filed: Jun. 11, 2013

(86) PCT No.: PCT/EP2013/001702
§ 371 (c)(1),
(2) Date: Dec. 11, 2014

(87) PCT Pub. No.: WO2013/185903
PCT Pub. Date: Dec. 19, 2013

(65) Prior Publication Data
US 2015/0179911 A1    Jun. 25, 2015

(30) Foreign Application Priority Data

Jun. 13, 2012 (DE) ........................ 10 2012 105 086

(51) Int. Cl.
*H01L 35/32* (2006.01)
*H01L 35/34* (2006.01)

(52) U.S. Cl.
CPC .............. *H01L 35/32* (2013.01); *H01L 35/34* (2013.01)

(58) Field of Classification Search
CPC ......... H01L 35/00; H01L 35/02; H01L 35/04; H01L 35/32; H01L 35/325
See application file for complete search history.

(56) References Cited

U.S. PATENT DOCUMENTS 2,519,785 A  *  8/1950  Okolicsanyi ............ H01L 35/32
                                                        101/127
3,554,815 A      1/1971  Osborn
(Continued)

FOREIGN PATENT DOCUMENTS

CH          413018 A      5/1966
DE        2002197 A1      8/1970
(Continued)

*Primary Examiner* — Christina Chern
(74) *Attorney, Agent, or Firm* — Leydig, Voit & Mayer, Ltd.

(57) ABSTRACT

A thermoelectric system includes a plurality of thermocouples that are each formed of two thermocouple limbs that include different thermoelectrically active materials. The thermocouple limbs are connected electrically in series and thermally in parallel. The thermodynamic system also includes a flexible and electrically insulating layer formed of a matrix having n rows of thermocouple limbs. The thermocouple limbs form columns having approximately equal widths. Each pair of adjacent thermocouple limbs has a contact region located on a straight fold line above one another in the column direction. The matrix is wound parallel to the rows on top of one another to form a flat strip. The matrix is then folded along the fold lines in the manner of a concertina with elevations and depressions equidistant to one another.

13 Claims, 7 Drawing Sheets

(56) References Cited

U.S. PATENT DOCUMENTS

| | | |
|---|---|---|
| 3,740,273 A | 6/1973 | Adler et al. |
| 3,981,751 A | 9/1976 | Dashevsky et al. |
| 2004/0075167 A1 | 4/2004 | Nurnus et al. |
| 2008/0173537 A1 | 7/2008 | Desteese et al. |
| 2009/0314324 A1 | 12/2009 | Murai et al. |
| 2011/0214707 A1 | 9/2011 | Suzuki et al. |

FOREIGN PATENT DOCUMENTS

| | | | |
|---|---|---|---|
| DE | 10122679 A1 | 12/2002 | |
| FR | 2620573 A1 | 3/1989 | |
| GB | 1021486 A * | 3/1966 | ............ H01L 35/00 |
| JP | 2006100346 A | 4/2006 | |
| JP | 2006269721 A | 10/2006 | |
| JP | 2008130594 A | 6/2008 | |
| WO | WO 0223642 A2 | 3/2002 | |
| WO | WO 2004105146 A1 | 12/2004 | |
| WO | WO 2005117154 A1 | 12/2005 | |

* cited by examiner

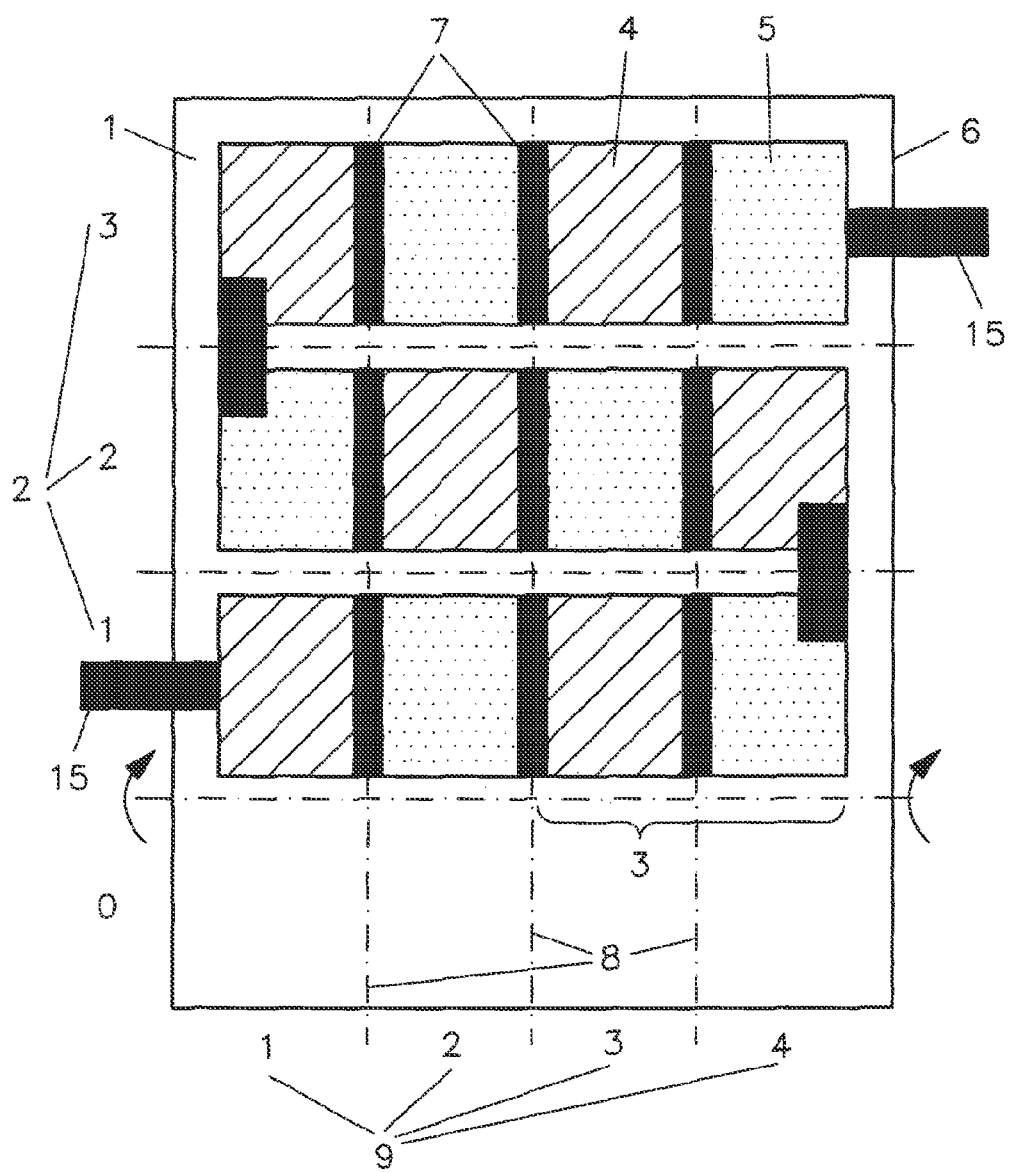

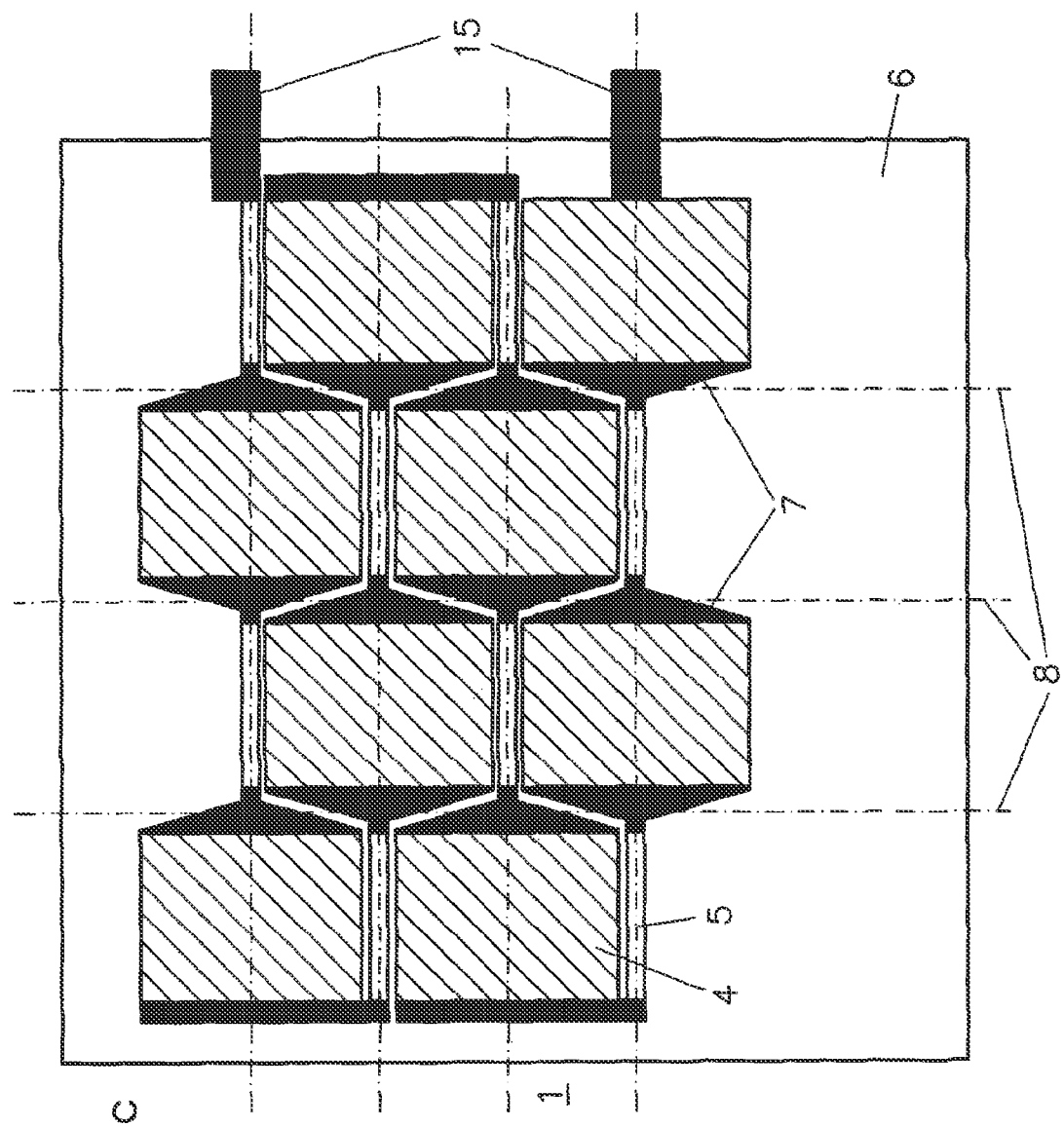

WOUND AND FOLDED THERMOELECTRIC SYSTEMS AND METHOD FOR PRODUCING SAME

CROSS-REFERENCE TO RELATED APPLICATIONS

This application is a U.S. National Phase application under 35 U.S.C. §371 of International Application No. PCT/EP2013/001702 (WO 2013/185903 A1), filed on Jun. 11, 2013, and claims benefit to German Patent Application No. DE 10 2012 105 086.4, filed Jun. 13, 2012.

FIELD

The present invention relates to thermoelectric systems, and in particular to thermoelectric systems comprising two different thermoelectrically active materials which form a thermocouple.

BACKGROUND

Generic thermoelectric systems take advantage of the Seebeck, Peltier and/or Thomson effects and may therefore be constructed as thermoelectric generators, which supply an electric current when arranged in a thermal gradient or as Peltier elements, which cool or generate heat when supplied with electrical energy. In order to be able to use these slight effects occurring at each thermocouple efficiently, a plurality of thermocouples is preferably connected in series.

For example, a so-called thermoelement or thermoelectric system comprising a plurality of thermocouple elements connected in series is known from DE 101 22 679 A1. Here, the thermocouples are applied to a substrate, for example a film. In the process, separate portions comprising thermoelectrically active materials with different Seebeck coefficients are arranged alternately in a plate-like manner next to each other and distanced from one another by means of webs or in a wavelike manner between two layers such as layers of clothing with different temperatures. Because of the large spaces between the strips of the individual thermoelectrically active materials or in the wavelike structure, between the waves, the effectiveness of the thermoelement falls. Furthermore, the thermoelectrically active materials are not insulated from one another so that a further convergence of the thermocouples is not possible due to the risk of short circuits alone. Finally, the thermoelement is not inherently rigid due to the thin-film substrate materials used such that in applications where inherent rigidness is required, an additional support structure is necessary.

A similarly constructed thermoelectric system is presented by Weber et al. (J. Weber, K. Potje-Kamloth, F. Haase, P. Detemple, F. Voelklein, T. Doll, "Coin-size coiled-up polymer foil thermoelectric power generator for wearable electronics", Sensors and Actuators, 132 (2006) 325-330). To produce this system, metal films were sputtered onto a polyamide foil, which was then wound up into a coil. This winding makes it possible to produce a series connection in continuous form, the thermoelectrically active materials being insulated from one another due to the winding. The problem with this is the wavelike structure of the thermoelectrically active materials in relation to each other, because unused intermediate spaces emerge as a result, which can lead to parasitic heat flow. Optimum use of the whole substrate surface by the thermocouples would be desirable instead.

Willfahrt et al. describe a method for printing thermoelectric generators (TEG) (A. Willfahrt, G. Huebner, E. Steiner, X. Crispin "Screen printed thermoelectric generator in a five layers vertical setup", Proceedings of Large-Area, Organic and Polymer Electronics Convention 28-30.06.2011 (LOPE-C 11), June 2011, Frankfurt/M., ISBN 978-3-00-034957-7). For this purpose, thermoelectrically different materials are printed in thin layers onto a flat substrate out of which strips are subsequently cut, which are stacked on top of one another and connected to one another in series with switched clamps. This subsequent connection is only possible in an industrial process at great expense, so the method is of no commercial interest. Moreover, the wavelike structure of the thermocouples has intermediate spaces which lead to the problems already referred to above.

FR 2 620 573 A1 discloses a concertina-like folded thermoelectric system comprising a plurality of thermocouples and a method for producing said system. In this method, the different thermoelectrically active materials are applied in long parallel strips to an insulating substrate, which in the next step is covered in a further insulating layer and folded in a meandering shape along the parallel strips. This results in a thermoelectric system, which although it uses the entire surface substrate with thermoelectrically active materials, the additional insulating coating makes the production process more complicated and an additional layer is obtained in the resulting folded thermoelectric system, which can lead to parasitic heat flow. Furthermore, the method described in FR 2 620 573 A1 has disadvantages if a batch print process is used for the coating since the number of thermocouples is limited to how many can be printed in one direction.

A folded thermoelectric generator emerges from CH 413 018 A, in which the thermoelements, which are folded in zigzag form, are produced by applying alternate strips of materials with different thermoelectric potentials onto a non-electrically conductive film base.

WO 2005 117 154 A1 discloses a thermoelectric semiconductor module, which is produced by a printing process or depositing under vacuum, thin p-type and n-type layers being applied lengthwise to a flexible thin layer in an alternating manner. The thermoelectric modules are either folded into a coil or a zigzag.

SUMMARY

In an embodiment, the present invention provides thermoelectric system that includes a plurality of thermocouples each formed of two thermocouple limbs that include different thermoelectrically active materials and that are connected electrically in series and thermally in parallel, the thermoelectrically active materials being disposed on a flexible and electrically insulating layer so as to form a matrix of n rows of the thermocouple limbs in columns having a same width; wherein contact regions of adjacent ones of the thermocouple limbs are each disposed on a straight fold line above one another in the column direction, and wherein the matrix is wound parallel to the rows on top of one another to form a flat strip and folded along the fold lines in the manner of a concertina with elevations and depressions equidistant to one another.

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following:

FIG. 1 shows a matrix of thermocouple limbs consisting of 3 rows with 2 thermocouples each;

FIG. 4c shows a matrix according to FIGS. 4a and 4b having a T-shaped geometry;

DETAILED DESCRIPTION

Figure 2A:
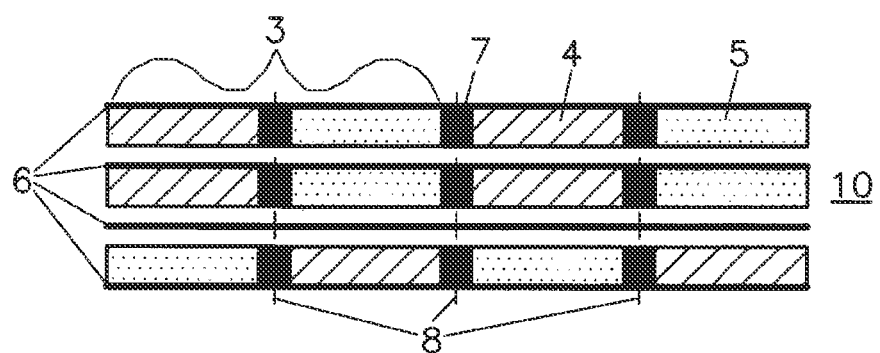
FIG. 2a is a cross section through a wound matrix from FIG. 1.

An embodiment of the invention provides an advantageously developed thermoelectric system and a method for producing such a system against a background of improved operational safety and large-scale production. The thermoelectric system produced in this way can be very compact so that the number of insulating layers is minimised. At the same time, the system can be flexibly adaptable to the different electrical conductivities of the two thermoelectrically active materials forming the thermocouple. The efficiency of the thermoelectric system can be increased at the same time.

An embodiment of the invention provides a thermoelectric system comprising two different thermoelectrically active materials which form a thermocouple and which are connected electrically in series and thermally in parallel. The thermoelectrically active materials are applied in thin layers to a substrate and wound and folded such that the two limbs of the thermocouple can be positioned upright in a thermal gradient in order to make the resulting thermoelectric system useful as a Peltier element or thermoelectric generator (TEG). The upright layers of thermoelectrically active materials are referred to hereinafter as thermocouple limbs.

A thermoelectric system according to an embodiment of the invention is constructed in the form of a matrix having n rows (where 2≤n≤1000) with any number of columns, of the same width, of fields of thermoelectrically active materials (thermocouple limbs), which are applied to a flexible and electrically insulating layer. By alternately applying the two different thermoelectrically active materials thermocouples emerge, by means of which the thermoelectric effect can be used. The contact regions of the two different thermoelectrically active materials of all the thermocouples are each located on a fold line in the column direction. The matrix is wound parallel to the rows on top of one another to form a strip and the strip is then folded into a stack along the fold lines in the manner of a concertina with elevations and depressions equidistant to one another.

In theory, when selecting a suitable thin flexible layer, the matrix can be wound as frequently as required such that an accordingly thick strip emerges. Preferably, however, the number of layers is between 2 and 250, more preferably 50 to 100 layers.

The length of the rows in the matrix can be selected at will. In one possible configuration of the matrix, all n rows have the same number of fields of thermoelectrically active materials. In another preferred configuration of the matrix, the rows can be offset by one or more fields. This configuration is expedient, for example, when the rows are not applied to the flexible layer at right angles to the coating direction.

Preferably, a wound and folded thermoelectric system according to an embodiment of the invention is compressed into a block. For this purpose, the flexible electrically insulating layer can optionally be provided with an adhesive layer on the reverse side. Preferably, this is an activatable adhesive layer. Activatable in this context means an adhesive layer which can be activated by changing a physical value, for example a temperature increase (when using a heat sealing layer), pressure increase or the influence of electromagnetic radiation. The adhesive layer can also be applied after production of the matrix but before folding.

Within the scope of the present invention, a thermocouple can be formed from two thermoelectrically active materials with different Seebeck coefficients, which cause different Seebeck voltages. For example, these could be metal pairings and their alloys, semiconductors in the form of p-type and/or n-type conductors and/or electrically conductive polymers or copolymers, which can preferably be of organic nature, and if appropriate, can have inorganic doping. For example, polyacetylene, polyaniline, polypyrrole, polythiophene and preferably Poly-3,4-ethylendioxythilophene doped with polystyrolsulphonate (PEDOT:PSS) and the like are suitable as organic, thermoelectrically active materials. Organic polymers, copolymers and the like are suitable in particular for the production and use of particularly thin thermoelectric systems as a result of their high elasticity, processability in thin layers and similar coefficients of expansion in respect of the embedded layers. Composite materials containing thermally insulating nano or micro particles in an organic matrix are well suited as thermoelectrically active materials. For example, the addition of $SiO_2$ particles, which are electrically and thermally insulating, in a PEDOT:PSS polymer material leads to the thermal conductivity of the material being reduced more than the electrical conductivity. Such materials are disclosed in US 2009/0314324 A1.

By using flexible materials, tight folding radii can be provided during the winding and folding of the matrix, which make it possible to lay the folds on top of one another and connect them to one another forming an inherently rigid block with wave peaks provided at the turning points, without the folds or the materials at the wave peaks of the folds being expanded excessively or even tearing. It has proven to be particularly advantageous here for the elasticity of the flexible and electrically insulating layer and the layers of the materials forming the thermocouple limbs to have similar or equivalent elasticity.

Thin plastics films, which are, for example, 1 µm to 100 µm, preferably approximately 10 µm thick, are particularly suitable as flexible and electrically insulating layers, such as preferably thermoplastics, for example polyethylene, polypropylene and the like, fabrics for example made from natural and/or synthetic fibres, and/or paints, for example on a synthetic resin base or the like, which are sprayed onto a smooth surface, for example, and after partial or full hardening are treated with the thermoelectrically active materials to form the strip.

In particular embodiments of the invention, therefore, a stack of different thermoelectrically active materials is provided, which are each separated from one another by the flexible and electrically insulating layer, so that no short circuits occur. Folding at the contact points of the thermocouples ensures that the stack substantially consists of parallel layers of the two thermoelectrically active layers, the turning points of the folds (wave peaks and wave troughs) each being able to be orientated towards a heat source and towards a heat sink respectively, as a result of which a thermoelectric generator is produced. In order to use a particular embodiment of the invention as a Peltier element, a thermal gradient from wave peak to wave trough can also be generated.

The material layers of the thermoelectrically active materials of the thermocouple limbs are constructed with a layer thickness of 1 µm to 100 µm, for example, preferably approximately 10 µm, and the individual fields have a width of between approximately 2 mm to 40 mm, preferably 5 mm to 20 mm. It has proven advantageous to connect approximately 50 to 200 thermocouples next to one another per row, for example, such that with a predefined length of strip from 0.5 m to 5 m, a stack of a few millimeters to more than one centimeter emerges as a result of the winding and folding process.

It is self-evident that to achieve thermoelectric systems with greater capacities, a plurality of these stacks can be connected in series or in parallel and accordingly large surfaces or spatial arrangements with heat gradients can be occupied thereby. Furthermore, the size of the stacks can be adjusted to the thermoelectric conditions.

In order to increase efficiency, the thermoelectric materials of the thermocouple limbs preferably touch each other across their entire height and overlap one another to produce a secure contact over their entire height. Alternatively, an intermediate layer can be applied between the edges of the material layers of the thermoelectrically active materials, which improves contact between the thermoelectrically active materials. For example, such an intermediate layer can be formed of metal. The height of the material layers is preferably such that a fold contains one material layer each of the first and second thermoelectrically active materials, their connection being provided at the turning points of the folds. In this case, the intermediate layer is arranged at the turning points of each fold and thus on opposite sides of the inherently rigid block and in addition to improving the contact with respect to the thermoelectrically active materials, can lead to an improved thermocoupling of the stack or the block formed therefrom to the heat source or heat sink of the thermoelectric system.

When using different thermoelectric materials forming a thermocouple which have different conductivities, such as a p-type polymer and a metallic n-type conductor, the surface of the field (thermocouple limb) of the better-conducting material can be constructed so as to be smaller such that the conductivity within the thermocouples does not vary too greatly and material can be saved. The thermoelectric systems according to the invention can allow such a construction in a very compact form, therefore without useable surface on the electrically insulating layer being lost. To construct this, fields of the different materials with the same width but different height are provided so as to alternate in every row of the matrix. The width of the fields should be identical so that the amplitude of the concertina folding is consistent. The height differences of the two thermocouple limbs within a row are compensated again by the offset fields of the adjacent rows. If, for example, an n-type conductor on the matrix is 1 mm high and the p-type conductor is 4 mm high, then steps are formed within a row, which are phase-shifted with the p-type conductors and n-type conductors of the adjacent rows to form a double row. This results in a pure material height of 5 mm in the double row, it being necessary to provide an insulating strip between the individual rows.

When thermocouple limbs of different heights are used, the contact surface between the material fields of the thermocouples can be adjusted. In the simplest case, the height of the contact surface is equivalent to the height of the smaller material field. Preferably, the contact surface is adjusted such that a triangular contact region is produced between the smaller and the larger field. This contact region is either produced by overlapping the two thermoelectric materials or by contacting with a contact-improving intermediate layer. Since the contact region is always located on a folding point, the contact point is exposed to a mechanical load. Therefore, the triangular contact proves to be advantageous since the fold extends over a larger contact region than in the case of simple contacting.

Furthermore, the object of the invention is achieved by a method for producing a thermoelectric system as described in the application documents. In this method, a matrix of thermocouple limbs forming thermocouples is first applied to a flexible and electrically insulating layer. The thermocouple limbs are produced by applying thin layers of thermoelectrically active materials and if applicable, an electrically-connecting intermediate layer such that n rows (where $2 \leq n \leq 1000$) with any required number of thermocouple limbs are produced, the contact regions between the thermocouple limbs each being located on a fold line in the column direction and each row end forming a contact region with the adjacent rows, so that an S-shaped serial current flow is ensured over the whole matrix. The matrix produced thus is wound parallel to the rows of serial thermocouples such that the rows are electrically insulated from one another, as a result of which a multi-layered strip with any required number of layers is produced. Preferably, the number of layers is between 2 and 200, more preferably between 50 and 100. The multi-layered strip is subsequently folded along the fold lines in the column direction in the manner of a concertina to form a stack with elevations and depressions equidistant to one another.

If paint is used as a flexible and electrically insulating layer, paint can be sprayed in a preferred method step onto a smooth surface, for example made of plastics material, metal, ceramic, glass or the like, one or both thermoelectrically active materials can, for example, also be sprayed, imprinted, vapour deposited or applied in another manner when the paint is dry or partially wet.

The coating of the flexible and electrically insulating layer can also be carried out in a virtually continuous process, in that the thermoelectrically active material or materials of the thermocouple are applied in a production direction to an unreeling roller, to plates, which are mounted opposite a securely mounted applicator and/or opposite a moving applicator, or the like.

Printing processes such as silk screen printing processes and preferably ink jet processes are suitable as a method for applying the thermoelectrically active materials. Appropriate printing inks can, for example, contain emulsions, slurries or suspensions of metals, semiconductors and/or conductive polymers for forming the thermoelectrically active materials of the thermocouples and, if applicable, auxiliary materials such as flux, emulsifiers for better flow during the printing process, elasticity-improving materials such as dissolved plastics components such as emollients and the like. Vapour deposit process such as CVD processes, sputtering processes and the like can also optionally be used.

Following production of the matrix, said matrix is first wound into a strip. In principle, the matrix can be wound in any way, it only being essential for the fold lines to lie on top of one another along the columns. The matrix is preferably wound row by row, but there is also the possibility of winding more than one row at a time or winding more than once within a row. When winding, care must be taken that the thermoelectrically active layers are electrically insulated from one another such that no short circuit occurs. This can, for example, be achieved in that a region of the flexible and electrically insulating layer remains unprinted and this is folded over onto the first row(s) of thermoelectrically active materials in the first winding step. In the following winding, an insulating layer and a printed layer always lie on top of one another. Preferably, the folds of the winding are located at the spaces in between the individual rows.

In order to facilitate the winding procedure in the continuous process, there is the possibility of applying the matrix onto the flexible layer in angled rows. This slanted matrix provides the advantage in the reel-to-reel production method that the winding can be performed continuously, directly when the matrix leaves the reel. The resultant stack continuously extends accordingly due to the slanted winding at the same angle to the production direction as predetermined by the angled direction of the rows. The stack can be cut to the required length and fed to the folding process.

The strip obtained by winding is then folded into a stack in the manner of a concertina by forming folds with wave peaks and wave troughs. The resultant folds are preferably compressed together and adhesively connected to one another forming an inherently rigid block. With respect to the adhesive connection of the folds to one another, a press process can be provided according to the connection of the flexible and electrically insulating layer, the adhesion being achieved by laminating, bonding or in another way so as to be adhesive or by integral bonding such as fusing.

For this purpose, an adhesive layer can optionally be applied to the reverse side of the flexible and electrically insulating layer in another step. When using an activatable adhesive layer, the coating can be carried out at any point in the process. When using a directly adhering adhesive, the adhesive is preferably applied after coating with the thermoelectric materials but before folding.

A thermoelectric system produced by means of the method can act as a Peltier element which, when a predetermined voltage is applied thereto, releases heat on one side of the wave peak of the thermocouple elements and absorbs heat on the opposite side and can therefore be used for heating or cooling. Furthermore, if there is a temperature difference between the wave peaks, electrical power can be taken under load at the poles of the thermocouple elements connected in series, which power is dependent on the temperature difference between the wave peaks. For example, when using the thermoelectric system, body heat can be used as an electrical energy source to generate light, to charge electronic devices such as mobile telephones and the like. Furthermore, such thermoelectric systems can be used in geothermal systems to generate electricity, in that for example large scale generators are installed below ground. These are maintenance free and have no moving parts. Furthermore, sensors, display devices and the like as well as their transmission devices such as transceiver systems can be operated independently of mains voltages, in that the proposed thermoelectric generators use existing temperature differences in the absence of other energy sources to generate electrical energy. Furthermore, energy losses producing temperature differences such as residual heat in power stations, insulation losses in houses and the like can be prevented or at least reduced by installing the proposed thermoelectric generators.

Figure 2B:
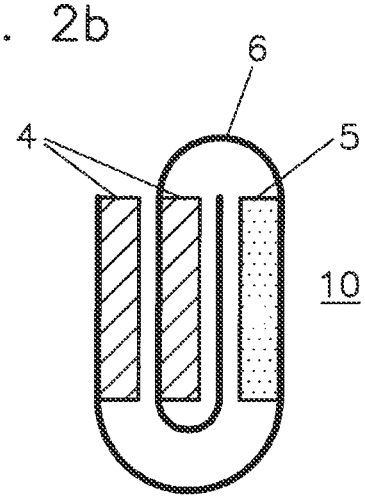
FIG. 2b is a side view of a wound matrix from FIG. 1.
Figure 3:
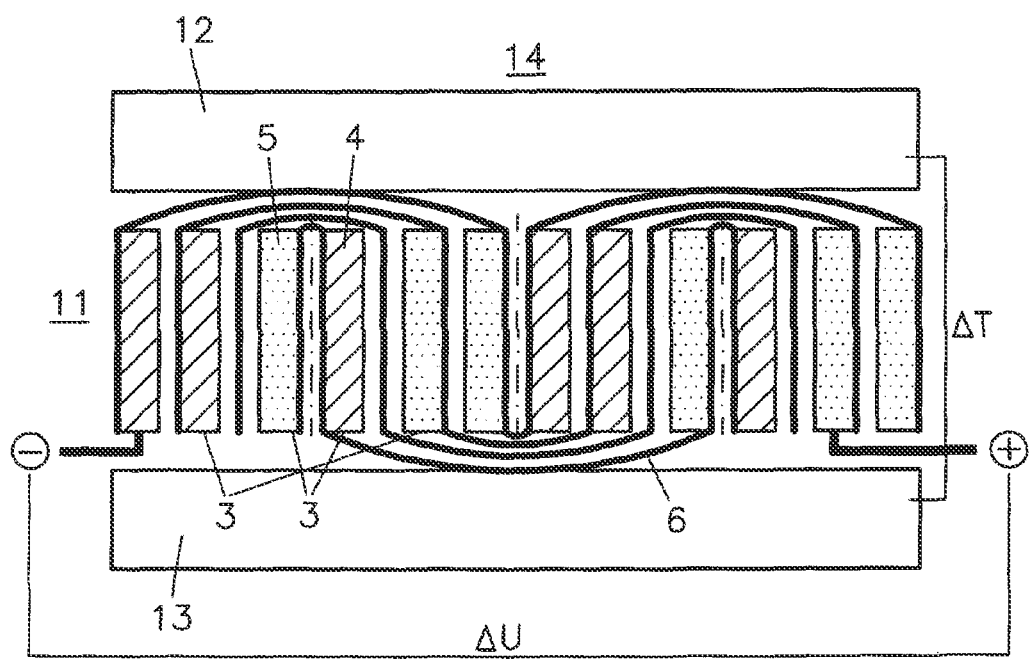
FIG. 3 is a schematic side view of a thermoelectric system.

FIGS. 1-3 schematically show the production of a thermoelectric system 11 according to an embodiment of the invention using a simple embodiment. Firstly, a matrix 1 according to FIG. 1 is provided consisting of three rows 2 of two thermocouples 3 each consisting of two different thermoelectrically active materials (4, 5), referred to here for simplification as n-type conductor 4 and p-type conductor 5, which are applied to a flexible and electrically insulating layer 6. The n-type and p-type conductors (4, 5) are each connected in series and electrically connected to one another via a contact region 7, for example in the form of an overlapping of the different thermoelectrically active materials (4, 5) or a contact-improving intermediate layer. In FIG. 1, the individual rows 2 of the matrix and the fold lines 8 along the columns 9 are shown specifically. It can be seen here that the fold lines 8 extend precisely along the contact regions 7 between the n-type and p-type conductors (4, 5) of the individual rows 2. The contact surfaces 15 are electrically conductively connected to the first and last n-type conductor 4 and p-type conductor 5 respectively and act as an outer contact of the thermoelectric system 11.

In a first step, the matrix 1 is wound parallel to the rows 2, it being necessary to ensure that the thermoelectrically active materials (4, 5) are insulated from one another so that no short circuit occurs in the thermoelectric system 11. In the present case, the neutralised row of the uncoated electrically insulating layer 6 is folded over before the matrix 1 is then wound up row by row into a strip 10. Coating on one side ensures that each row 2 is electrically insulated. In principle, however, any required winding is possible as long as it extends parallel to the rows 2. The strip 10 resulting from winding is shown schematically in a cross-sectional drawing in FIG. 2a. FIG. 2b is the side view of this strip 10 where it can be seen how the layers of the thermoelectrically active materials (4, 5, thermocouple limbs) are separated from one another by the electrically insulting layer 6. The strip 10 is folded in the subsequent step along the contact regions 7, which are located on top of one another, in the manner of a concertina to form a stack. A thermoelectric system 11 in the configuration of meandering thermocouple limbs (FIG. 3) results from this folding, the method of production ensuring that the electric current in the n-type conductor 4 always flows in the same direction as the heat gradient and the current in the p-type conductor 5 always flows accordingly in the opposite direction.

FIG. 3 schematically shows a cross section of the thermoelectric system 11 in the form of the thermoelectric generator 14 which is effective, between the heat blocks 12, 13, with the temperature difference $\Delta T$. In order to provide the thermoelectric effect of the thermoelectric generator 14, a stack, which has been produced according to FIG. 1-3 and has a thermocouple 3 made from two thermoelectrically active materials 4, 5 with different Seebeck coefficients, is arranged between the heat blocks 12, 13. The six (n=3) thermocouples 3 and twelve thermocouple limbs respectively are connected in series, a voltage difference $\Delta U$ being formed between the poles +, −, depending on the temperature difference $\Delta T$ between the heat blocks 12, 13, due to the thermoelectric effect during series connection, from which voltage difference electrical current can be obtained under load.

Figure 4A:
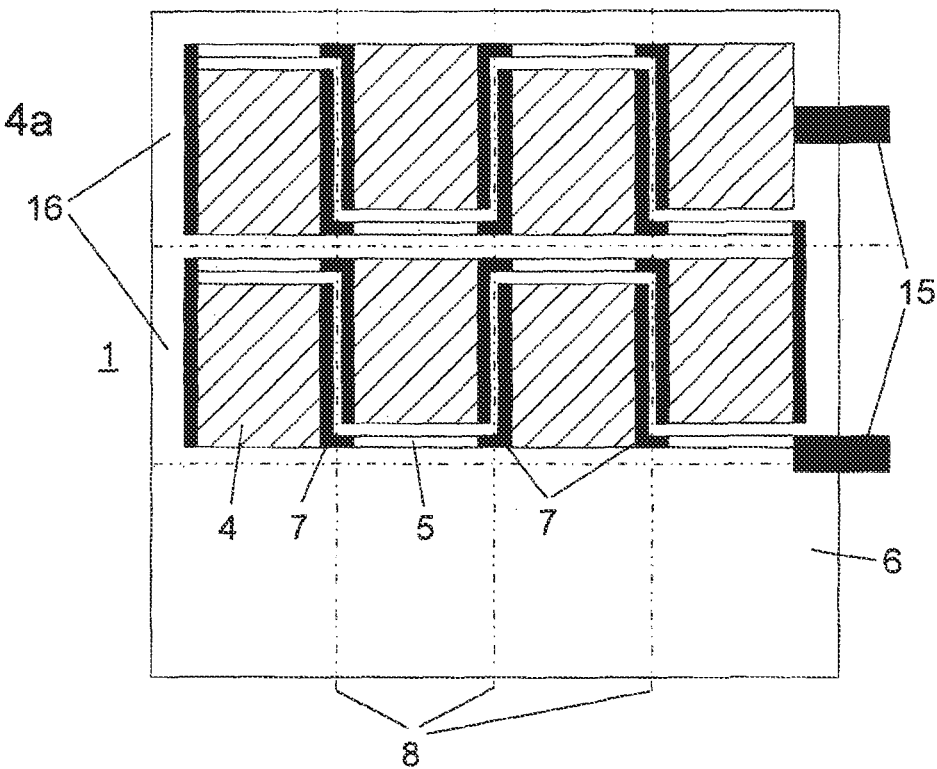
FIG. 4a shows a matrix in an embodiment having thermoelectrically active materials of different conductivities.
Figure 4B:
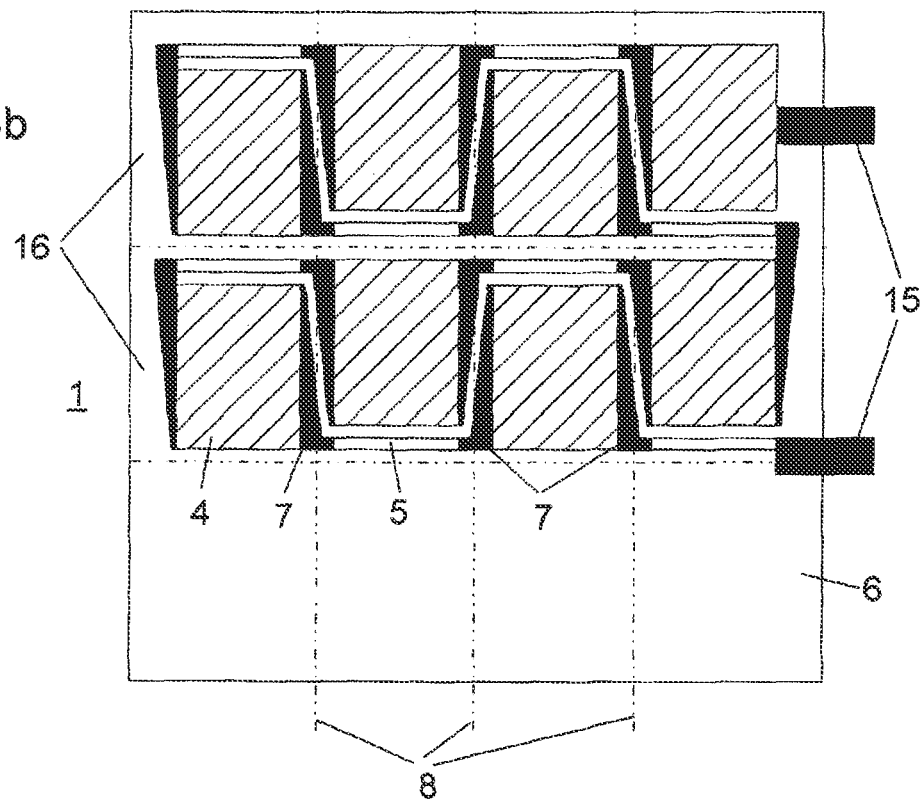
FIG. 4b shows a matrix according to FIG. 4a having a triangular contact surface geometry.

In FIG. 4a and FIG. 4b further embodiments of the matrix 1 are shown, which are advantageous if the materials of the thermocouple limbs have different electrical conductivities.

If, for example, the p-type conductor 5 conducts better than the n-type conductor 4 belonging to the thermocouple, the material surface of the two thermocouple limbs 4, 5 can be adjusted such that the p-type conductor 5 has a lower height than the n-type conductor 4. As shown in FIG. 4a and FIG. 4b, the fields of the two thermocouple limbs, which have different heights, can be complemented, with an exact fit, by the respective adjacent field of the next row 2 to form a double row 16, which leads to a more compact structure.

In FIG. 4c another embodiment of the matrix 1 is shown, which is advantageous if, similarly to FIG. 4a and FIG. 4b, the materials of the thermocouple limbs have different electrical conductivities and additionally the effective path of the current is to be minimised in the contact region 7.

In the case of fields with different heights, the contact region 7 between the n-type and p-type conductors 4, 5 can be adjusted. In FIG. 4a the height of the contact region 7 is equivalent to the height of the material with the lower electrical conductivity. Since the contact region 7 is simultaneously the turning point in the concertina-like folds, this bend should extend over as large a material surface as possible so that the mechanical load brought about by the fold, which can possibly lead to hairline cracks in the contact region 7, can be compensated. In FIG. 4b this contact region 7 is tapered in the form of a triangle from the better conductor to the stronger conductor. This geometry produces a larger contact region 7 at the bend as compared to the embodiment in FIG. 4a.

Figure 4D:
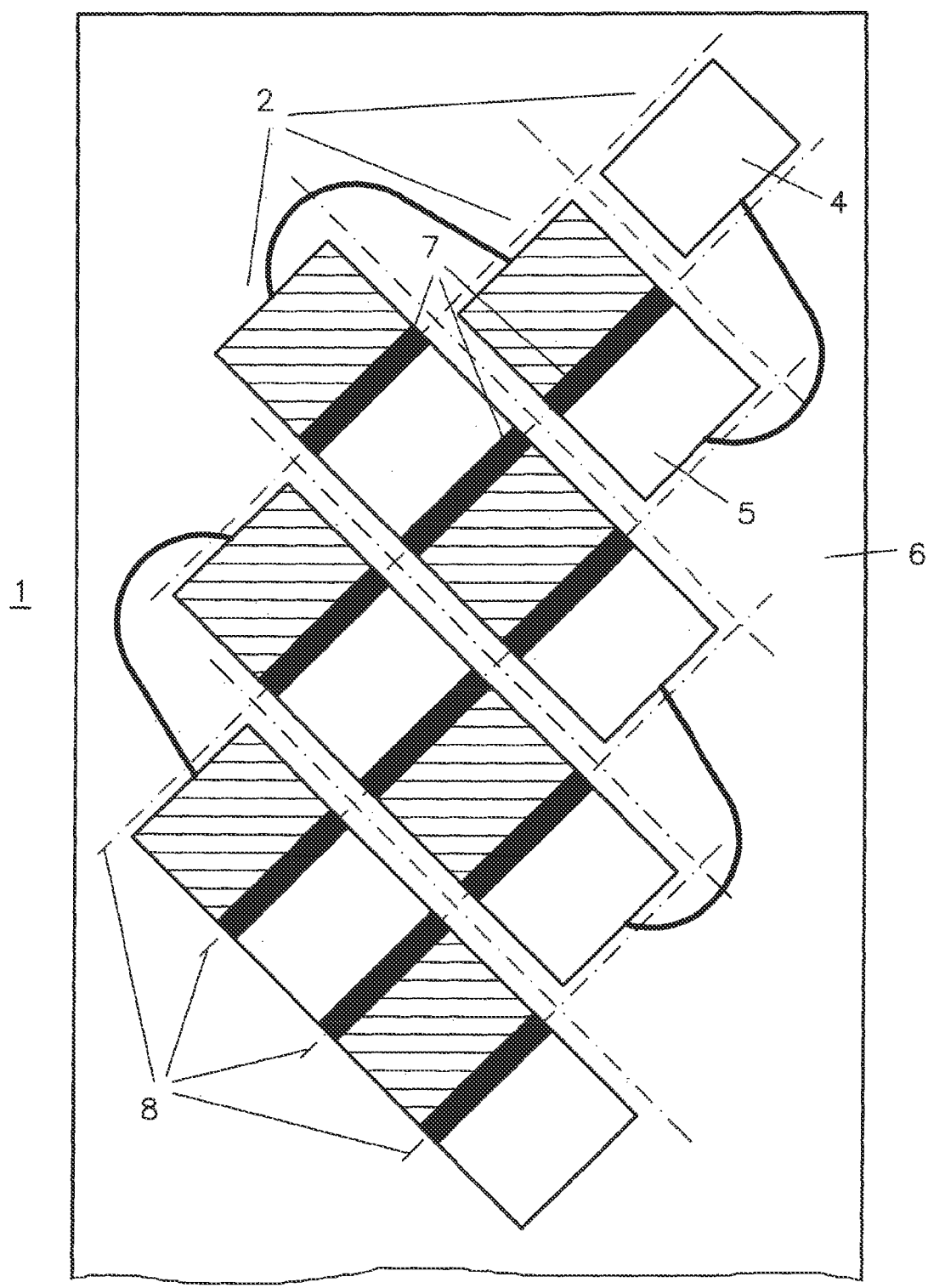
FIG. 4d shows a matrix having angled rows.
Figure 5:
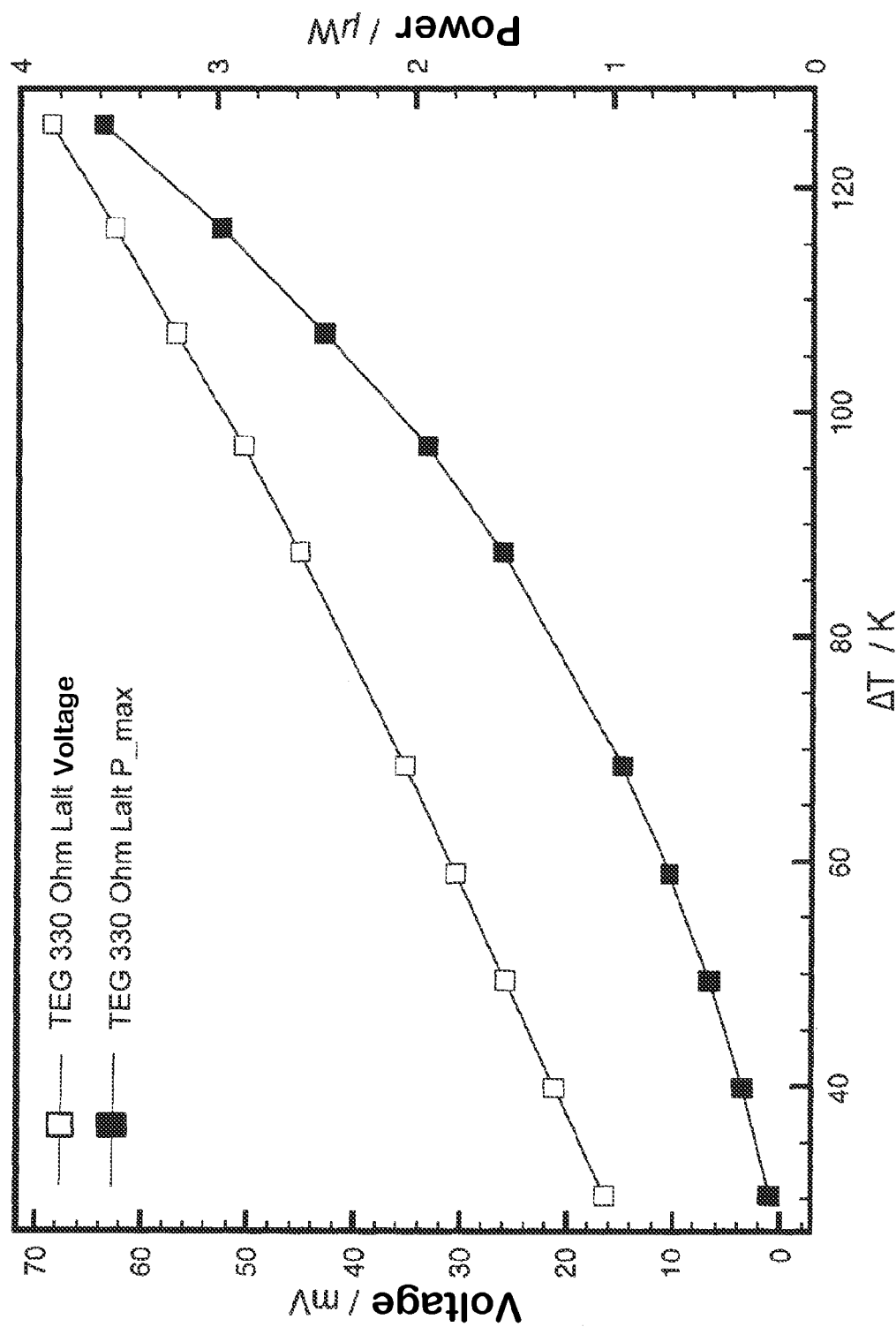
FIG. 5 shows voltage and power curves of a thermoelectric generator from Example 1 as a function of ΔT.

A further embodiment of the matrix 1 comprises an angled row direction of the n-type and p-type conductors 4, 5 as shown in FIG. 4d. It can be seen here that the matrix 1 has been wound at an angle to the production direction so that the winding is parallel to the rows 2 and the fold lines 8 lie on top of one another. The strip 10 resulting from this winding extends with every layer in the direction of the rows. This configuration is advantageous in the continuous method since the coating process does not need to be interrupted when a thermoelectric system 11 of the desired size has been achieved. It is possible to cut off the strip 10, which has been obtained, at the appropriate length in order to feed it to the folding process.

Example 1: Production of a TEG According to an Embodiment of the Invention

A matrix 1 comprising eleven rows 2 with a total of 93 thermocouples 3 has been printed onto a 12 μm thick substrate film of polyester acting as a flexible insulating layer 6. By way of trial, metallic silver, as the n-type conductor 5, and polysulphonic acid-doped poly(3-4 ethylenedioxythiophene) (PEDOT:PSS), as the p-type conductor 4, were used as the thermoelectrically active materials forming the thermocouple. Firstly, the film 6 was placed on a DIN A4 cleanroom paper on the vacuum table of a silk screen printing machine. After suction and smoothing down, the film 6 was first printed with a silver paste using the 165-27 screen. After printing, the film was dried in an oven for approximately 10 minutes at 120° C. Afterwards, PEDOT:PSS ink was printed three times successively with a 10-260 screen and likewise dried in the oven for approximately 10 minutes each time. The thermocouple elements were contacted by an intermediate layer 7, which in the present case was an overlapping region of the two thermoelectrically active materials.

After printing, the starts of the thermocouple series connection were contacted above and below at the sides with silver conductive paint as the contact surface 15. Then the film 6 was cut such that above the first row 2 about as much unprinted film 6 remained so that it could overlap the first row 2. Then the matrix 1 was wound row by row, the unprinted film 6 first being laid onto the adjacent row 2. After folding over the last length of film, this fold was sealed onto the resultant strip 10 by means of an iron. An autonomous unwinding was thus prevented. The strip 10 was now folded into a stack in the manner of a concertina as shown in FIG. 3. The folding points of each row 2 are located on top of one another at the contact regions 7. Then the stack was compressed into a block with a strip of kapton tape.

Example 2: Voltage Metering

The thermoelectric system 11 obtained in example 1 was used as a thermoelectric generator (TEG) 14 and the resultant electrical voltage recorded. In order to carry out these measurements, a thermoelectric system 11 was inserted into a measurement device, which can generate a thermal gradient, as shown schematically in FIG. 3. In order to carry out the measurement, one side of the TEG was maintained at 20° C. while the other side was gradually heated up to 145° C. At the contact points 15 of the stack the resultant voltage was measured simultaneously. In FIG. 6 the development of the voltage and power are set out as a function of the temperature difference $\Delta T$ between the two heat blocks 12, 13. The measured output voltage $\Delta U$ of the TEG changes proportionally to the applied temperature difference $\Delta T$. Likewise recorded here is the change in power, which rises quadratically with the increasing temperature difference $\Delta T$ because of the quadratic dependence of the voltage. These measured values prove that an electric current can be produced efficiently using the thermoelectric system 11.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

REFERENCE SYMBOL LIST

1 Matrix
2 Rows
3 Thermocouple 4 n-type conductor
5 p-type conductor
6 Electrically insulating layer
7 Contact region
8 Fold lines
9 Columns
10 Strips
11 Thermoelectric system
12 Heat block
13 Heat block
14 Thermoelectric generator
15 Contact surface
16 Double row
ΔT Temperature difference
ΔU Voltage difference

The invention claimed is:

1. A thermoelectric system comprising:
a plurality of thermocouples each formed of two thermocouple limbs that include different thermoelectrically active materials and that are connected electrically in series and thermally in parallel, the thermoelectrically active materials being disposed on a flexible and electrically insulating layer so as to form a matrix of a plurality of parallel rows of the thermocouple limbs shaped in columns having a same width;
wherein contact regions of adjacent thermocouple limbs are each disposed on a straight fold line above one another in a column direction, and
wherein the matrix is wound parallel to the rows on top of one another to form a flat strip in which a region of the flexible and electrically insulating layer that has no thermoelectrically active materials disposed on either a front side or a back side thereof is folded over onto a first row of the thermocouple limbs so as to electrically insulate the first row of thermocouple limbs from a second row of thermocouple limbs, and wherein the flat strip is folded along the fold lines in the manner of a concertina with elevations and depressions equidistant to one another.

2. The thermoelectric system of claim 1, wherein the contact regions between the thermocouple limbs are provided with a contact-improving intermediate layer.

3. The thermoelectric system of claim 1, wherein the flat strip is compressed into a block.

4. The thermoelectric system of claim 1, wherein the different thermocouple limbs are made of thermoelectrically active materials applied to the flexible and electrically insulating layer in different areas according to their electrical conductivity.

5. The thermoelectric system of claim 1, wherein the electrically insulating layer comprises one of a plastics film, a fabric, or a paint.

6. The thermoelectric system of claim 1, wherein the electrically insulating layer comprises an adhesive layer on a reverse side.

7. A method for producing a thermoelectric system, the method comprising:
producing, a plurality of thermocouples each formed of two thermocouple limbs that include different thermoelectrically active materials and that are connected electrically in series and thermally in parallel, the thermoelectrically active materials being disposed on a flexible and electrically insulating layer, forming a matrix of a plurality of parallel rows of the thermocouple limbs shaped in columns having a same width, wherein contact regions of adjacent thermocouple limbs are each disposed on a straight fold line above one another in a column direction;
winding the matrix parallel to the rows such that the rows lie on top of one another to form a flat strip in which a region of the flexible and electrically insulating layer that has no thermoelectrically active materials disposed on either a front side or a back side thereof is folded over onto a first row of the thermocouple limbs so as to electrically insulate the first row of thermocouple limbs from a second row of thermocouple limbs; and
folding the flat strip along the fold lines in the manner of a concertina with elevations and depressions equidistant to one another.

8. The method of claim 7, the method further comprising applying at least one intermediate layer electrically connecting at least two of the thermoelectrically active materials disposed on the flexible and electrically insulating layer.

9. The method of claim 8, wherein the flexible and electrically insulating layer is formed by spraying paint onto a smooth surface before the thermoelectrically active materials are disposed thereon.

10. The method of claim 7, wherein the flexible and electrically insulating layer is provided with an adhesive layer on a reverse side.

11. The method of claim 7, further comprising compressing the wound and folded thermoelectric system adhesively into a block.

12. The method of claim 7, wherein the thermoelectrically active materials are disposed on the flexible and electrically insulating layer by being printed thereon.

13. The thermoelectric system of claim 1, wherein the thermoelectrically active materials are disposed on the front side of the flexible and electrically insulating layer,
and wherein the matrix is wound parallel to the rows on top of one another to form the flat strip such that the front side of the region of the flexible and electrically insulating layer contacts the first row of the thermocouple limbs and the back side of the region of the flexible and electrically insulating layer contacts the second row of thermocouple limbs.

* * * * *